(12) United States Patent
Lin et al.

(10) Patent No.: US 8,742,443 B2
(45) Date of Patent: Jun. 3, 2014

(54) LIGHT EMITTING DIODE EPITAXIAL STRUCTURE AND MANUFACTURING METHOD OF THE SAME

(75) Inventors: Ya-Wen Lin, Hsinchu (TW); Shih-Cheng Huang, Hsinchu (TW); Po-Min Tu, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 33 days.

(21) Appl. No.: 13/517,554

(22) Filed: Jun. 13, 2012

(65) Prior Publication Data

US 2013/0119421 A1    May 16, 2013

(30) Foreign Application Priority Data

Nov. 10, 2011    (CN) .......................... 2011 1 0354599

(51) Int. Cl.
| | |
|---|---|
| *H01L 27/15* | (2006.01) |
| *H01L 33/22* | (2010.01) |
| *H01L 33/20* | (2010.01) |

(52) U.S. Cl.
CPC ................. *H01L 33/22* (2013.01); *H01L 33/20* (2013.01)
USPC ........... 257/98; 257/E33.068; 438/29; 438/44

(58) Field of Classification Search
CPC ............................... H01L 33/20; H01L 33/22
USPC .......... 257/98, E33.067, E33.068; 438/29, 44
See application file for complete search history.

(56) References Cited

U.S. PATENT DOCUMENTS

| | | | |
|---|---|---|---|
| 2008/0142824 A1* | 6/2008 | Chen et al. ...................... | 257/98 |
| 2008/0169482 A1* | 7/2008 | Kang .............................. | 257/98 |
| 2009/0114935 A1* | 5/2009 | Huang et al. .................... | 257/98 |
| 2010/0219437 A1* | 9/2010 | Usuda et al. .................... | 257/98 |
| 2012/0001220 A1* | 1/2012 | Hiraiwa et al. ................. | 257/98 |
| 2012/0305948 A1* | 12/2012 | Lo et al. .......................... | 257/88 |
| 2013/0023074 A1* | 1/2013 | Horng et al. .................... | 438/29 |

* cited by examiner

*Primary Examiner* — Allan R Wilson
(74) *Attorney, Agent, or Firm* — Novak Druce Connolly Bove + Quigg LLP

(57) ABSTRACT

An LED epitaxial structure includes a substrate, a buffer layer, a functional layer and a light generating layer. The buffer layer is located on a top surface of the substrate. The functional layer includes a plurality of high-temperature epitaxial layers and low-temperature epitaxial layers alternatively arranged between the buffer layer and light generating layer. A textured structure is formed in the low-temperature epitaxial layer. A SiO2 layer including a plurality of convexes is located on the textured structure to increase light extraction efficiency of the LED epitaxial structure. A manufacturing method of the LED epitaxial structure is also disclosed.

16 Claims, 9 Drawing Sheets

LIGHT EMITTING DIODE EPITAXIAL STRUCTURE AND MANUFACTURING METHOD OF THE SAME

BACKGROUND

1. Technical Field

The disclosure is related to a light emitting diode (LED) epitaxial structure and a manufacturing method of the same, and particularly to an LED epitaxial structure having good light emitting efficiency and the manufacturing method of the same.

2. Description of Related Art

Light emitting diodes (LEDs) are technologically and economically advantageous solid state light sources. LEDs are capable of reliably providing light with high brightness, hence in the past decades they have come to play a critical role in numerous applications, including flat-panel displays, traffic lights, and optical communications. The conventional procedures for producing LEDs are primarily to epitaxy a layered light emitting structure with pn junction on a sapphire substrate. The performance of such LEDs is seriously degraded by the presence of threading dislocations, which thread vertically through the epitaxial layers. In particular, when a sapphire substrate is used, it does not dissipate heat efficiently and there is a strong tendency of light emission efficiency not to increase linearly in proportion to an input, but to be saturated halfway. It is known in the art that the light emission from electroluminescent devices or from LEDs is limited by the total internal reflection occurring at the surface between the semiconductor substrate wherein the device is fabricated and the surrounding medium. Therefore, what is needed is an LED structure that reduces the amount of emitted light that is lost through various loss mechanisms, thereby increasing the overall output of the device.

BRIEF DESCRIPTION OF THE DRAWINGS

The components in the drawings are not necessarily drawn to scale, the emphasis instead being placed upon clearly illustrating the principles of an LED epitaxial structure and a manufacturing method of the LED epitaxial structure. Moreover, in the drawings, like reference numerals designate corresponding parts throughout the several views.

DETAILED DESCRIPTION

The disclosure will be described with references to the accompanying diagrams.

Figure 1:
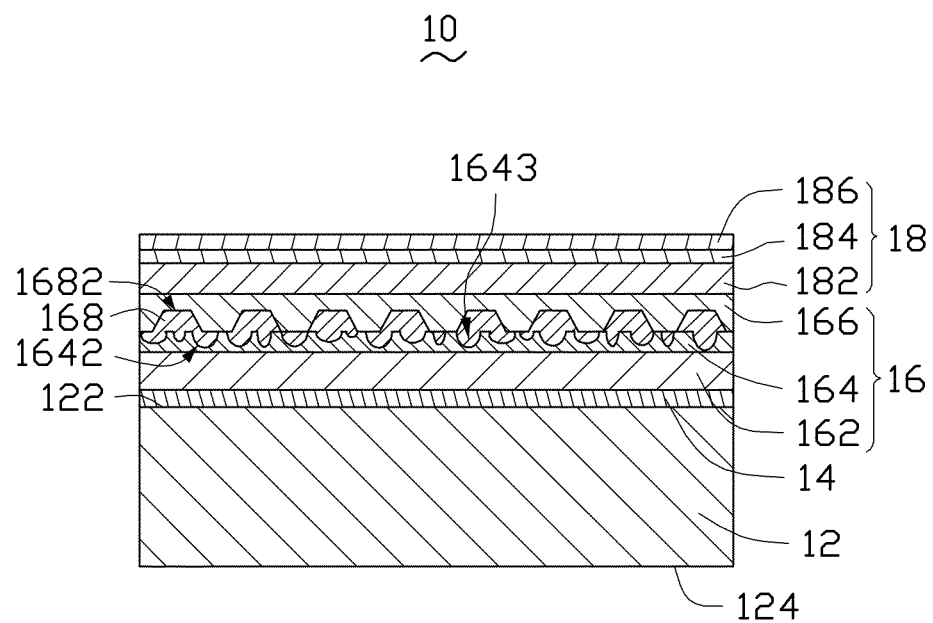
FIG. 1 is a cross-sectional view of an LED epitaxial structure according to a first embodiment of the disclosure.

FIG. 1 shows a cross-sectional diagram of an LED epitaxial structure 10 of the disclosure. The LED epitaxial structure 10 has a substrate 12, a buffer layer 14, a functional layer 16 and a light generating layer 18. The substrate 12 is a sapphire substrate and has a top surface 122 and a bottom surface 124. The top surface 122 is a smooth and flat surface and the buffer layer 14 is positioned on the top surface 122. The functional layer 16 includes a first high-temperature epitaxial layer 162, a low-temperature epitaxial layer 164, and a second high-temperature epitaxial layer 166 sequentially located on the buffer layer 14. The first high-temperature epitaxial layer 162, the second high-temperature epitaxial layer 166, and the low-temperature epitaxial layer 164 may be un-doped epitaxial layers or n-doping epitaxial layers. For instance, if the first high-temperature epitaxial layer 162 and the second high-temperature epitaxial layer 166 are high-temperature un-doped epitaxial layers, the low-temperature epitaxial layer 164 sandwiched between them is a low-temperature un-doped layer. On the other hand, if the first high-temperature epitaxial layer 162 and the second high-temperature epitaxial layer 166 are high-temperature n-doping epitaxial layers, the low-temperature epitaxial layer 164 sandwiched between them is a low-temperature n-doping layer. In the disclosure, each of the first high-temperature epitaxial layer 162 and the second high-temperature epitaxial layer 166 is formed in a higher processing temperature than the low-temperature epitaxial layer 164.

The low-temperature epitaxial layer 164 has a textured structure 1642, which is formed at a top surface of the low-temperature epitaxial layer 164. In other words, the textured structure 1642 is positioned between the low-temperature epitaxial layer 164 and the second high-temperature epitaxial layer 166 as viewed from FIG. 1. The textured structure 1642 includes a plurality of cavities 1643, which are randomly arranged in the top surface of the low-temperature epitaxial layer 164. The LED epitaxial structure 10 further has a SiO2 layer 168 covering on the low-temperature epitaxial layer 164 and filling the cavities 1643 of the textured structure 1642. The SiO2 layer 168 includes a plurality of convexes 1682, which are arranged regularly or irregularly over the low-temperature epitaxial layer 164. The interval between two adjacent convexes 1682 is smaller than a diameter of each convex 1682. For example, the diameter of each convex 1682 is approximately 3 μm and the interval between two adjacent convexes 1682 is 2 μm. If the diameter of each convex 1682 is approximately 2 μm and the interval between two adjacent convexes 1682 is 1 μm. The shape of the convexes 1682 may be round, rectangular, or polygonal. The SiO2 layer 168 is overlapped by the second high-temperature epitaxial layer 166.

The light generating layer 18 is located on the second high-temperature epitaxial layer 166. The light generating layer 18 includes an n-epitaxial layer 182, an active layer 184, and a p-epitaxial layer 186 sequentially formed on the second high-temperature epitaxial layer 166. Lights generated by the active layer 184, transmitting interiorly in the LED epitaxial structure 10, are reflected at the textured structure 1642 and the convexes 1682 thereby to increase the light extraction efficiency of the LED epitaxial structure 10.

Figure 2:
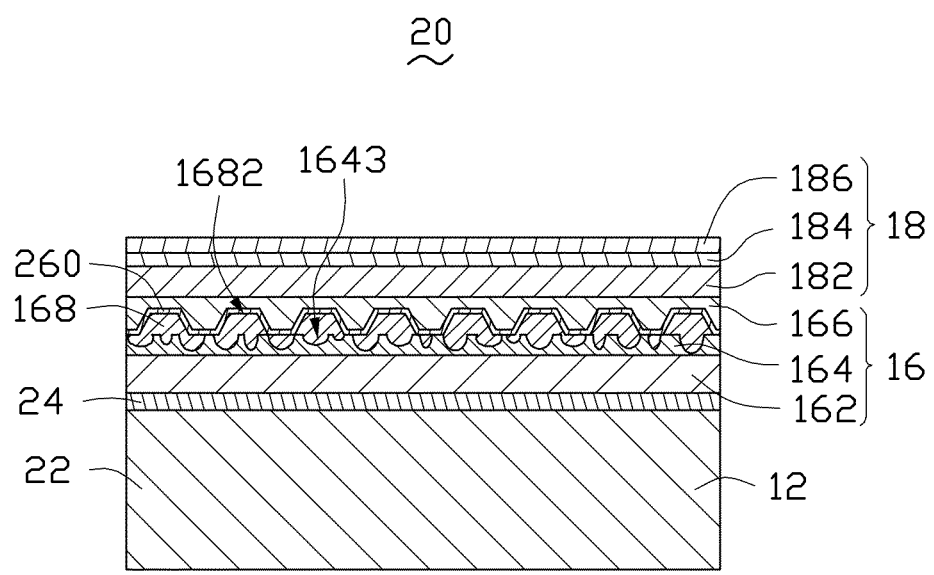
FIG. 2 is a cross-sectional view of an LED epitaxial structure according to a second embodiment of the disclosure.

FIG. 2 shows an LED epitaxial structure 20 according to a second embodiment of the disclosure. The LED epitaxial structure 20 has a structure similar to the LED epitaxial structure 10 of the first embodiment. The difference there between is in that the LED epitaxial structure 20 further has a laminated film 260 covering on the SiO2 layer 168 as a part of the functional layer 16. The laminated film 260 is made of high-temperature AlN. Since the lattice constant of the AlN and the epitaxial layers are close, growing the second high-temperature epitaxial layer 166 on the laminated film 260 is easier than on the SiO2 layer 168. Therefore, the processing time of the LED epitaxial structure 20 in the reacting chamber is reduced to prevent the LED epitaxial structure 20 from damages caused by the high processing temperature in the reacting chamber.

Figure 3:
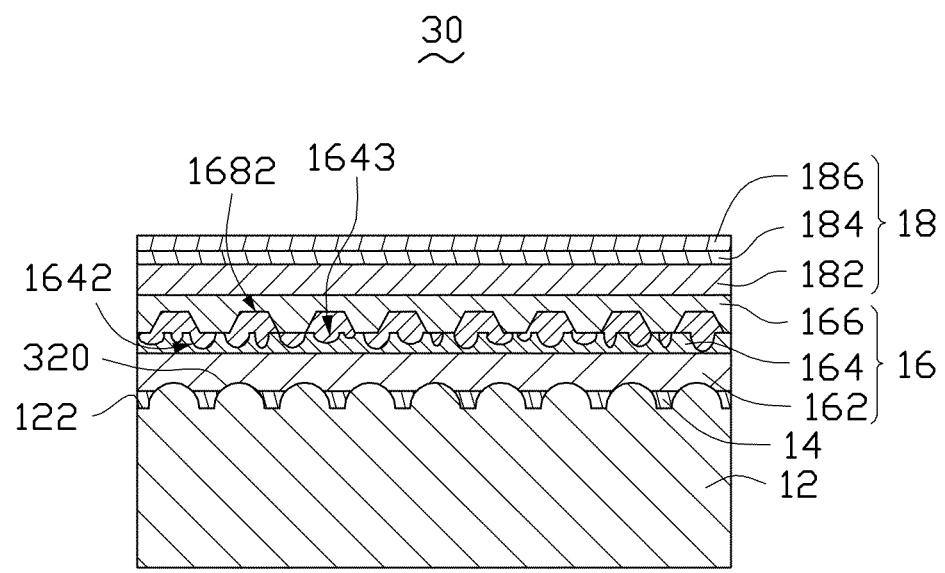
FIG. 3 is a cross-sectional view of an LED epitaxial structure according to a third embodiment of the disclosure.
Figure 4:
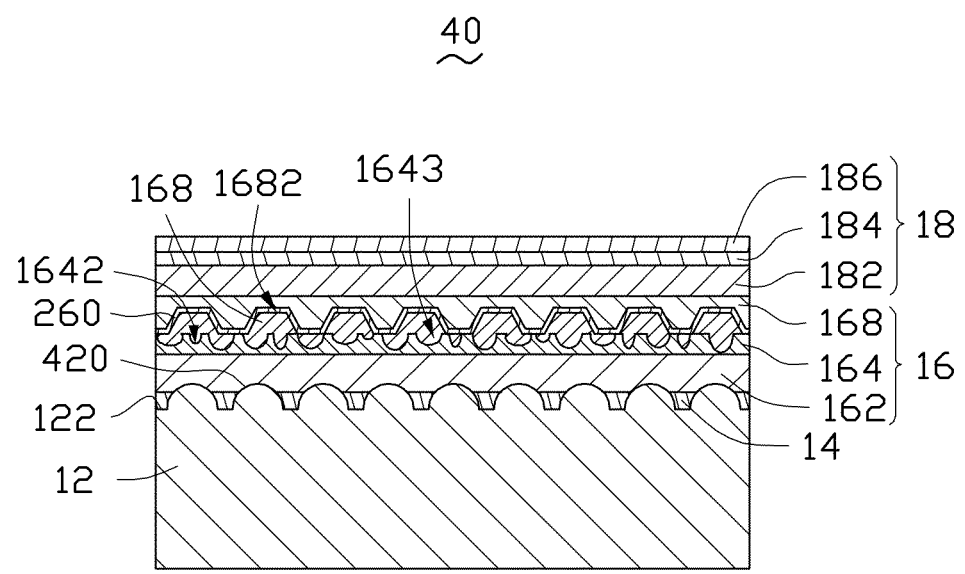
FIG. 4 is a cross-sectional view of an LED epitaxial structure according to a fourth embodiment of the disclosure.

FIG. 3 shows an LED epitaxial structure 30 according to a third embodiment of the disclosure. The LED epitaxial structure 30 has a structure similar to the LED epitaxial structure 10 of the first embodiment. The difference there between is in that the LED epitaxial structure 30 further has a pattern 320 formed on the top surface 122 of the substrate 12. FIG. 4 shows an LED epitaxial structure 40 according to a fourth embodiment of the disclosure. The LED epitaxial structure 40 has a structure similar to the LED epitaxial structure 20 of the second embodiment. The difference there between is in that the LED epitaxial structure 40 further has a pattern 420 formed on the top surface 122 of the substrate 12. Both the pattern 320 in the third embodiment and the pattern 420 in the fourth embodiment have same function as the textured surface 1642 to increase light extraction efficiency of the LED epitaxial structure 30, 40.

Figure 5:
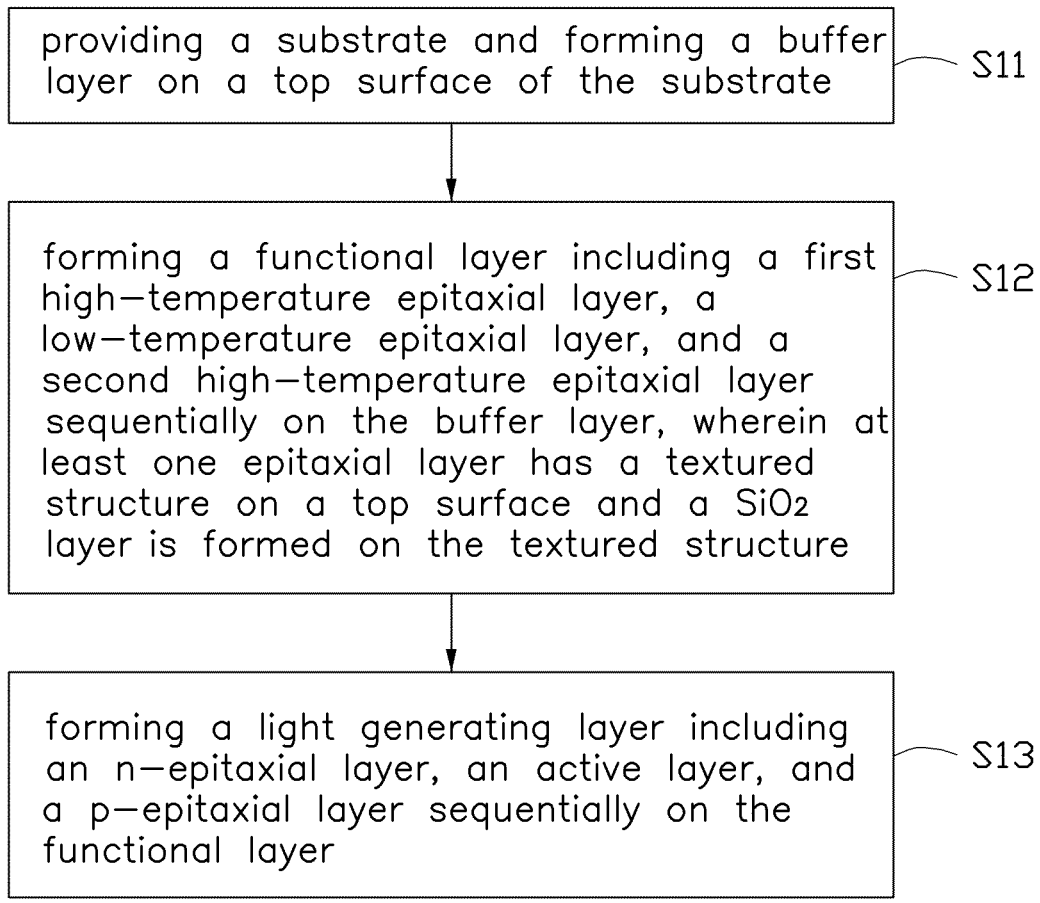
FIG. 5 is a flow chart illustrating a manufacturing method of the LED epitaxial structure of the disclosure.

FIG. 5 shows a manufacturing method of the LED epitaxial structure of the disclosure. The manufacturing method includes the following steps:

Step S11: providing a substrate and forming a buffer layer on a top surface of the substrate, wherein the top surface of the substrate may be smooth and flat or have a pattern thereon;

Step S12: forming a functional layer including a first high-temperature epitaxial layer, a low-temperature epitaxial layer, and a second high-temperature epitaxial layer sequentially on the buffer layer, wherein at least one epitaxial layer has a textured structure on a top surface of the epitaxial layer and a SiO2 layer is formed on the textured structure; and Step S13: forming a light generating layer including an n-epitaxial layer, an active layer, and a p-epitaxial layer sequentially on the functional layer.

In step S11, the substrate 12 is a sapphire substrate and has a smooth and flat top surface 122 (also see FIG. 1 and FIG. 2). The top surface 122 may have a pattern 320, 420 (also see FIG. 3 and FIG. 4). The buffer layer 14 is formed on the top surface 122 of the substrate 12.

Figure 6:
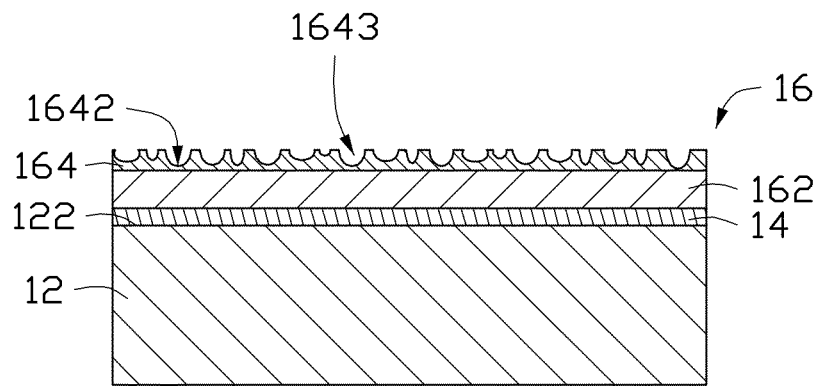
FIG. 6 is a cross-sectional view showing a semi-finished product for the LED epitaxial structure of FIG. 1 which has a low-temperature epitaxial layer having a textured surface with a plurality of cavities defined therein.
Figure 8:
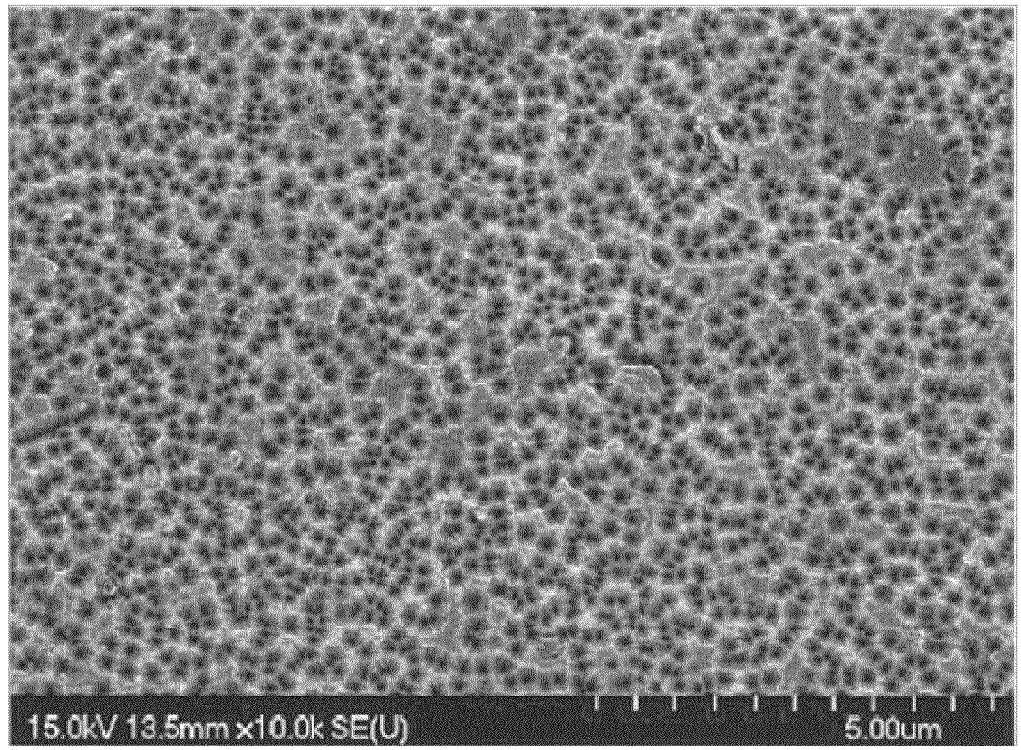
FIG. 8 shows a surface image of the textured structure of the low-temperature epitaxial layer of FIG. 6 by scanning electron microscope (SEM).

In step S12, the functional layer 16 is grown on the buffer layer 14. The first high-temperature epitaxial layer 162, the low-temperature epitaxial layer 164, and the second high-temperature epitaxial layer 166 are sequentially formed on the buffer layer 14. The first high-temperature epitaxial layer 162, the second high-temperature epitaxial layer 166, and the low-temperature epitaxial layer 164 may be un-doped epitaxial layers or n-doping epitaxial layers. The first high-temperature epitaxial layer 162 and the second high-temperature epitaxial layer 166 are grown in a processing temperature higher than that for the low-temperature epitaxial layer 164 to be grown. The textured surface 1642 including a plurality of cavities 1643 are formed in a top surface of the low-temperature epitaxial layer 164 (see FIG. 6). Since the low-temperature epitaxial layer 164 is grown in a lower temperature, more defects are formed during the growth to form the irregular textured structure 1642 of the low-temperature epitaxial layer 164. FIG. 8 shows the surface images of the textured structure 1642 of the low-temperature epitaxial layer 164 by scanning electron microscope (SEM). The cavities 1642 of the textured structure 1642 may be formed by an inductively coupled plasma reactive ion etching process or by an ion bombardment process.

Figure 7:
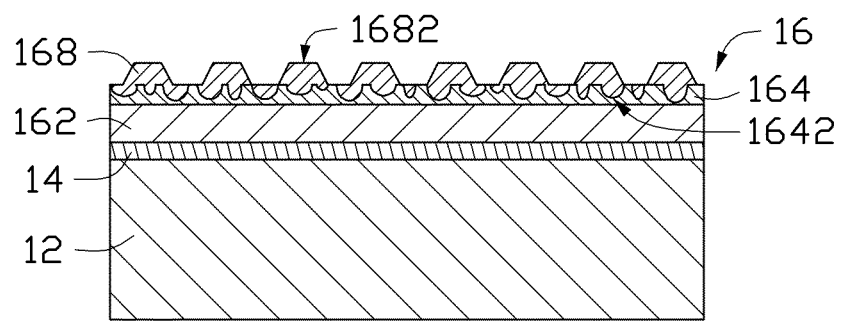
FIG. 7 is a view similar to FIG. 6 showing a SiO2 layer formed on the low-temperature epitaxial layer of FIG. 6, wherein the SiO2 layer has a plurality of convexes.
Figure 9:
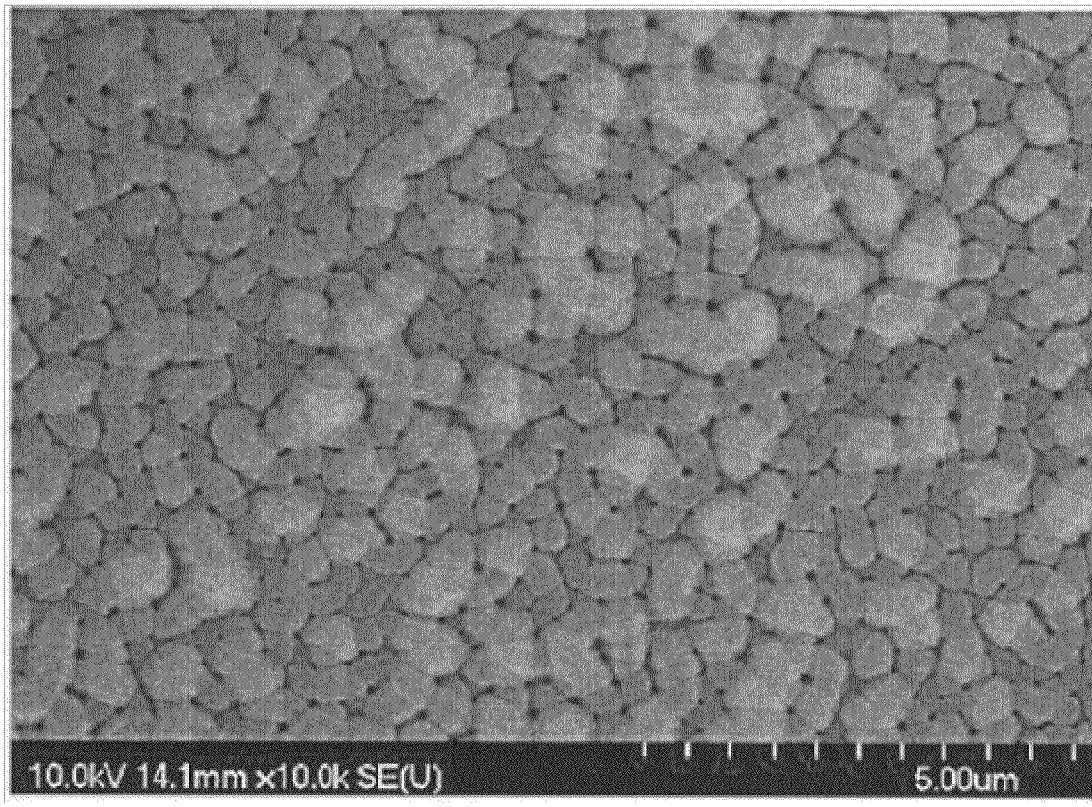
FIG. 9 shows a surface image of the SiO2 layer of FIG. 7 by SEM.

After the textured structure 1642 is formed, the SiO2 layer 168 is deposited on the textured structure 1642 to fill the cavities 1643 (see FIG. 7). The SiO2 layer 168 is polycrystalline silicon and formed with a plurality of visible grains (see FIG. 9) to stack on the textured structure 1682. The SiO2 layer 168 is then etched to form the convexes 1682 (see FIG. 7) regularly or irregularly arranged on the textured structure 1642. Then, the second high-temperature epitaxial layer 166 is formed, so that the main components of the functional layer 16 are formed.

In step S13, the light generating layer 18 including the n-epitaxial layer 182, the active layer 184 and the p-epitaxial layer 186 are sequentially formed on the functional layer 16. Accordingly, the LED epitaxial structure of the present disclosure is formed.

Furthermore, the manufacturing method of the disclosure may further include a step of forming a laminated film 260 made of high-temperature AlN on the SiO2 layer 168. The advantages regarding the provision of the high-temperature AlN laminated film 260 on the SiO2 layer 168 can be referred to the disclosure in connection with the LED epitaxial structure 20 of FIG. 2.

As described above, the LED epitaxial structure of the disclosure has the textured structure 1624 and the convexes 1682 formed in the interior of the LED epitaxial structure. The substrate 12 may has the pattern 320, 420 on the top surface 1222. The textured structure 1624, the convexes 1682, and the pattern 320, 420 increase light extraction efficiency of the LED epitaxial structure of the disclosure.

Although the present disclosure has been specifically described on the basis of this exemplary embodiment, the disclosure is not to be construed as being limited thereto. Various changes or modifications may be made to the embodiment without departing from the scope and spirit of the disclosure.

What is claimed is:

1. An LED epitaxial structure comprising:
   a substrate;
   a buffer layer positioned on a top surface of the substrate;
   a light generating layer; and
   a functional layer located between the buffer layer and the light generating layer, the the functional layer comprising:
   at least two high-temperature epitaxial layers;
   a low-temperature epitaxial layer sandwiched between the at least two high-temperature epitaxial layers and having a textured structure; and
   a SiO2 layer located on the textured structure and sandwiched between the at least two high-temperature epitaxial layers, the SiO2 layer comprising a plurality of convexes.

2. The LED epitaxial structure of claim 1, wherein the top surface of the substrate is a smooth and flat surface and the substrate is a sapphire substrate.

3. The LED epitaxial structure of claim 1, wherein the top surface of the substrate has a pattern.

4. The LED epitaxial structure of claim 1, wherein the at least two high-temperature epitaxial layers are a first high-temperature un-doped epitaxial layer and a second high-temperature un-doped epitaxial layer, and the low-temperature epitaxial layer is a low-temperature un-doped epitaxial layer.

5. The LED epitaxial structure of claim 1, wherein the at least two high-temperature epitaxial layers are a first high-temperature n-doping epitaxial layer and a second high-temperature n-doping epitaxial layer, and the low-temperature epitaxial layer is a low-temperature n-doping epitaxial layer.

6. The LED epitaxial structure of claim 1, wherein the textured structure is defined in a top surface of the low-temperature epitaxial layer, and the textured structure comprises a plurality of cavities filled by the SiO2 layer.

7. The LED epitaxial structure of claim 1, wherein the convexes are irregularly arranged, and an interval between two adjacent convexes is smaller than a diameter of the convex.

8. The LED epitaxial structure of claim 1, wherein the convexes are regularly arranged, and an interval between two adjacent convexes is smaller than a diameter of the convex.

9. The LED epitaxial structure of claim 1 further comprising a laminated film made of high-temperature AlN positioned on a top surface of the SiO2 layer.

10. The LED epitaxial structure of claim 1, wherein the light generating layer comprises an n-epitaxial layer, an active layer, and a p-epitaxial layer sequentially positioned on an upper one of the at least two high-temperature epitaxial layers.

11. A manufacturing method of an LED epitaxial structure, comprising steps of:
    providing a substrate and growing a buffer layer on a top surface of the substrate;
    forming a functional layer on a top surface of the buffer layer, the functional layer comprising:
      at least two high-temperature epitaxial layers;
      a low-temperature epitaxial layer sandwiched between the at least two high-temperature epitaxial layers and comprising a textured structure; and
      a SiO2 layer sandwiched between the at least two high-temperature epitaxial layers and formed on the textured structure, wherein the SiO2 layer has a plurality of convexes; and
    forming a light generating layer on the functional layer, the light generating layer comprising a n-epitaxial layer, an active layer, and a p-epitaxial layer sequentially positioned on the functional layer.

12. The manufacturing method of claim 11, wherein the at least two high-temperature epitaxial layers are a first high-temperature un-doped epitaxial layer and a second high-temperature un-doped epitaxial layer, and the low-temperature epitaxial layer is a low-temperature un-doped epitaxial layer.

13. The manufacturing method of claim 11, wherein the at least two high-temperature epitaxial layers are a first high-temperature n-doping epitaxial layer and a second high-temperature n-doping epitaxial layer, and the low-temperature epitaxial layer is a low-temperature n-doping epitaxial layer.

14. The manufacturing method of claim 11, wherein the low-temperature epitaxial layer is formed in a lower processing temperature than that for the at least two high-temperature epitaxial layers to be formed.

15. The manufacturing method of claim 11 further comprising a step of forming a laminated film on the SiO2 layer, wherein the laminated film is sandwiched between the SiO2 layer and an upper one of the at least two high-temperature epitaxial layers and comprises a material of high-temperature AlN.

16. The manufacturing method of claim 11, wherein the textured structure is formed by processing a top surface of the low-temperature epitaxial layer with one of following processes: an inductively coupled plasma reactive ion etching process and an ion bombardment process.

\* \* \* \* \*